(12) United States Patent
Hsuan

(10) Patent No.: US 7,192,847 B2
(45) Date of Patent: Mar. 20, 2007

(54) ULTRA-THIN WAFER LEVEL STACK PACKAGING METHOD

(75) Inventor: Min-Chih Hsuan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 140 days.

(21) Appl. No.: 10/906,136

(22) Filed: Feb. 4, 2005

(65) Prior Publication Data

US 2005/0173789 A1   Aug. 11, 2005

(30) Foreign Application Priority Data

Feb. 5, 2004   (TW) .............................. 93102569 A

(51) Int. Cl.
| | |
|---|---|
| H01L 21/44 | (2006.01) |
| H01L 21/48 | (2006.01) |
| H01L 21/50 | (2006.01) |
| H01L 21/301 | (2006.01) |
| H01L 21/46 | (2006.01) |

(52) U.S. Cl. .................. 438/464; 438/109; 438/110; 438/118; 257/777; 257/458; 257/E21.599; 257/E21.596; 257/686

(58) Field of Classification Search ............... 438/464, 438/109, 110, 118; 257/777, 686
See application file for complete search history.

(56) References Cited

U.S. PATENT DOCUMENTS

| 5,000,811 A * | 3/1991 | Campanelli .................. 156/264 |
| 5,547,906 A * | 8/1996 | Badehi ........................ 438/109 |
| 6,849,523 B2* | 2/2005 | Chao et al. .................. 438/460 |
| 2006/0172510 A1* | 8/2006 | Connell et al. ............. 438/464 |

* cited by examiner

*Primary Examiner*—Nitin Parekh
(74) *Attorney, Agent, or Firm*—Jiang Chyun IP Office

(57) ABSTRACT

A method of forming an ultra-thin wafer level stack package and structure thereof are provided. The method includes providing a first wafer having a plurality of base chips thereon, selectively binding the first wafer to a second substrate, lapping the first wafer to reduce its thickness, dicing the lapped first wafer, bonding a plurality stack chips to each base chip and packaging the base chip with the bonded stack chips to form an IC package. Thus, each IC package comprises at least a base chip and a stack chip. The IC package has a size almost identical to the base chip and a thickness a little larger than the combined thickness of the base chip and the stack chip. If a known good die inspection of the base chips and stack chips are carried out prior to wafer level packaging, overall yield of the IC package is increased.

22 Claims, 6 Drawing Sheets

ULTRA-THIN WAFER LEVEL STACK PACKAGING METHOD

CROSS-REFERENCE TO RELATED APPLICATION

This application claims the priority benefit of Taiwan application serial no. 93102569, filed on Feb. 5, 2004.

BACKGROUND OF THE INVENTION

1. Field of the Invention

The present invention relates to a semiconductor chip packaging technology. More particularly, the present invention relates to a method of forming a stack package and structure thereof.

2. Description of the Related Art

In recent years, the technology developments and the popularity of portable, handheld and consumer electronic products has almost overshadowed the conventional personal computer (PC) products. To facilitate the manufacturing of these electronic products, most devices are designed towards higher storage capacity and smaller line width to increase the packing density, the operational frequency, to reduce the power consumption and to achieve the integration of multi-functions. In the packaging technology of the integrated circuits (ICs), the chip scale package (CSP) and the wafer level package have been invented to meet the requirements for higher input/output pin count, higher heat-dissipating capacity and reduction of the package size. Furthermore, associated packaging techniques for reducing the weight and cost are also being developed.

In the development of the chip scale package (CSP), a variety of techniques such as the single chip package, the stack chip package and the planar multi-chip package (MCM) are developed. The aforementioned techniques can reduce the dimension of a package to a size only slightly larger than the original size of the chip. However, the technology of the stack chip packages and the planar multi-chip packages must be combined with the known good die (KGD) technique to produce a high yield.

Unlike the conventional chip scale package (CSP) method, the waver level package or wafer level chip scale package (WL-CSP) method packages an entire wafer before dicing up the wafer. Hence, the WL-CSP method can eliminate many process steps such as underfilling, assembling, substrate processing, chip attaching and wire bonding so that the overall fabrication cost can be substantially reduced. In general, the wafer can be packaged regardless of the size of the chip or the pin count. In other words, the wafer level packaging is able to reduce the process steps to thereby shorten the fabrication cycle time, to improve the performance and to lower down the cost. In addition, the amount of saving increases correspondingly with the size of the wafer. Therefore, the wafer level packaging method is particularly advantageous to the wafer processing plants shifting from 8-inch wafer production to 12-inch wafer production.

System on chip (SOC) and system in a package (SIP) are regarded as two principal techniques for producing miniaturized and multi-functional semiconductor devices in the future. In particular, the system on chip (SOC) technique has some promising applications in manufacturing digital information products. At present, the multi-chip package modules with high operating frequency, low cost, small size and short fabrication cycle are the dominant packaging type. For example, a drawing chip or a memory chip is often fabricated by the multi-chip package technology to achieve the high processing frequency, super-fast processing speed and the capacity of integration of multi-functions. Therefore, the known good die technique is important in the packaging process of the multi-chip package technology. After a number of chips are packaged, and the electrical properties of each packaged chip is tested. The chips that fail the test are immediately discarded and the chips that pass the test are integrated by attaching to a packaging product. In this way, the area of the printed circuit board of the package system is reduced and the yield of a conventional multi-chip package is increased.

SUMMARY OF THE INVENTION

Accordingly, at least one object of the present invention is to provide a method of forming an ultra-thin wafer level stack package capable of simplifying the packaging process and increasing overall yield and throughput of the package.

To achieve these and other advantages and in accordance with the purpose of the present invention, as embodied and broadly described herein, the present invention provides a method of forming an ultra-thin wafer level stack package and package structure thereof. The package structure of the present invention comprises an independent chip set. The independent chip set is obtained by dicing an selectively adhered wafer. The selectively adhered wafer comprises a first wafer and a second substrate attached to the first wafer by using a plurality of adhesives, wherein the second substrate may comprise a plurality of chips, and the positions of the chips are matched with the first wafer. The first wafer has a plurality of base chips formed thereon. The first wafer separates from the second substrate by a distance equal to the thickness of the adhesive glue layer. Accordingly, each independent chip set comprises a base chip and a portion of the second substrate. In addition, a method of forming the adhesives may comprise, for example, a dispensing method. Moreover, a method of forming the adhesives may comprise forming a double side tape having a region comprising the adhesives. Thereafter, after the selectively adhered wafer is obtained and before the independent chip sets are formed, a thermal curing step may further be performed for curing the adhesives.

The method of forming an ultra-thin wafer level stack packages, providing a first wafer having a plurality of base chips thereon, and a second substrate. Next, a first surface of the first wafer is bonded to a first surface of the second substrate by using a plurality of adhesives to form an selectively adhered wafer, wherein a distance between the first wafer and the second substrate is equal to a thickness of the adhesives. Next, a plurality of independent chip sets are formed, wherein each of the independent chip sets comprises the base chip and a portion of the second substrate. The independent chip set is formed by cutting a second surface of the first wafer of the selectively adhered wafer and cutting a second surface of the second substrate of the selectively adhered wafer. In addition, a method of cutting the selectively adhered wafer may comprise a diamond blade cutting method or a laser cutting method. Finally, the independent chip sets are packaged to achieve a packaged IC or chip.

In a preferred embodiment of the present invention, a process of detecting a known good die (KGD) of the base chips of the first wafer is carried out before the commencement of the packaging.

In another preferred embodiment of the present invention, one or more stacked chips are bonded to the base chip after the step of forming the independent chip sets but before the step of packaging the independent chip sets.

In another preferred embodiment of the present invention, the second surface of the first wafer is polished after the step of forming the selectively adhered wafer but before the step of cutting the second surface of the first wafer of the selectively adhered wafer.

According to an aspect of the present invention, at least a stack chip is also attached to the base chip of each independent chip set.

According to another aspect of the present invention, the first wafer has a thickness between 200 µm to 500 µm.

According to another aspect of the present invention, a polishing process is performed over the surface of the first wafer after producing the selectively adhered wafer but before dicing a surface of the first wafer in the selectively adhered wafer.

According to another aspect of the present invention, the first wafer has a thickness between 30 µm to 250 µm after polishing the first wafer in the selectively adhered wafer.

According to another aspect of the present invention, the first wafer preferably has a thickness between 30 µm to 80 µm after polishing the first wafer in the selectively adhered wafer.

According to another aspect of the present invention, a 'known good die' (KGD) inspection of the stack chip or base chip is performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
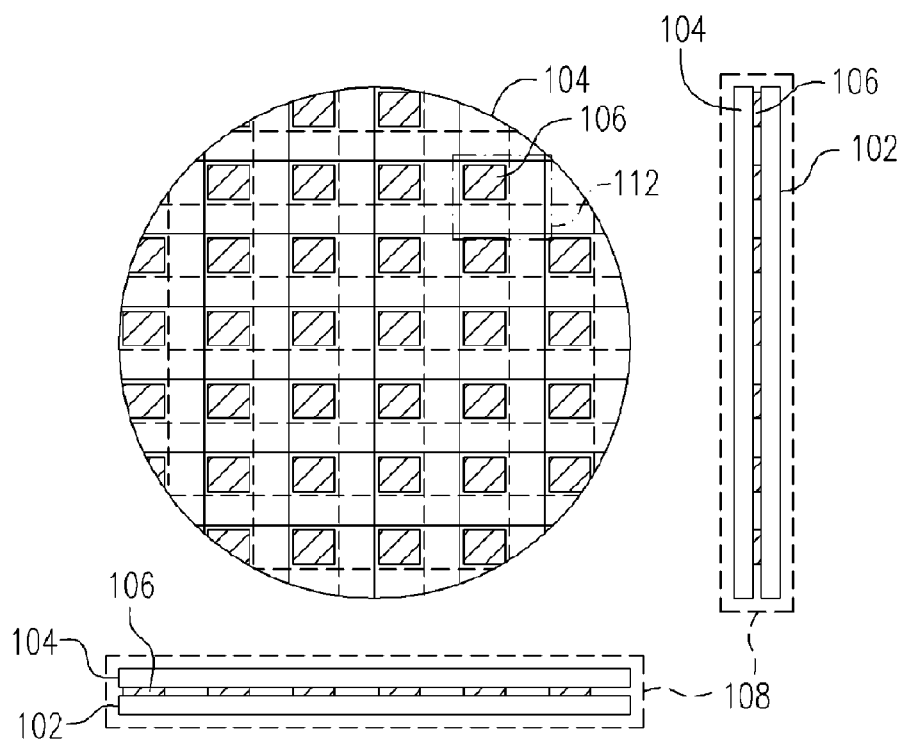
FIGS. 1 to 8 are top views and cross-sectional views illustrating a process of forming an ultra-thin wafer level stack package and package structure according to the preferred embodiment of the invention.

FIGS. 1 to 8 are top views and cross-sectional views illustrating the process of forming an ultra-thin wafer level stack package according to a preferred embodiment of the present invention. First, referring to FIG. 1, a first wafer 102 having a plurality of base chips 112 thereon is provided. As shown, an area marked by the intersection of a solid horizontal line and a solid vertical line defines each base chip 112. A second substrate 104 is also provided, wherein the second substrate 104 may comprise no chip, or one or more chips previously formed thereon, and the size and position of the chips previously formed has been preset to match with the first wafer 102. The second substrate 104 can be a transparent or a non-transparent glass substrate comprised of, for example, but not limited to, a silicon wafer substrate, a plastic substrate, an acrylic substrate or a polymer substrate. Thereafter, the second substrate 104 is adhered to the surface of the first wafer 102 with the base chips 112 through a plurality of adhesives 106 to form a selectively adhered wafer 108. Referring to FIG. 1, only a few specific areas on the first wafer 102 are adhered to the adhesive 106. The first wafer 102 separates from the second substrate 104 by a distance equal to the thickness of the adhesives 106. In one embodiment of the present invention, the method of forming the adhesives 106 comprises, for example, dispensing method. In another embodiment of the present invention, a specific double side tape, for example, having a shape the same as the first wafer 102 may be provided. In addition, the adhesives 106 may be disposed on a portion of the specific double side adhesive tape, for example, the portion corresponding to the first wafer 102. Therefore, after the first wafer 102 is adhered to the second substrate 104 by the adhesives 106, a thermal curing process may further be performed for curing the adhesives 106.

In one preferred embodiment of this invention, a known good die (KGD) inspection of the base chips 112 on the first wafer 102 is carried out prior to the commencement of the packaging process.

Figure 2:
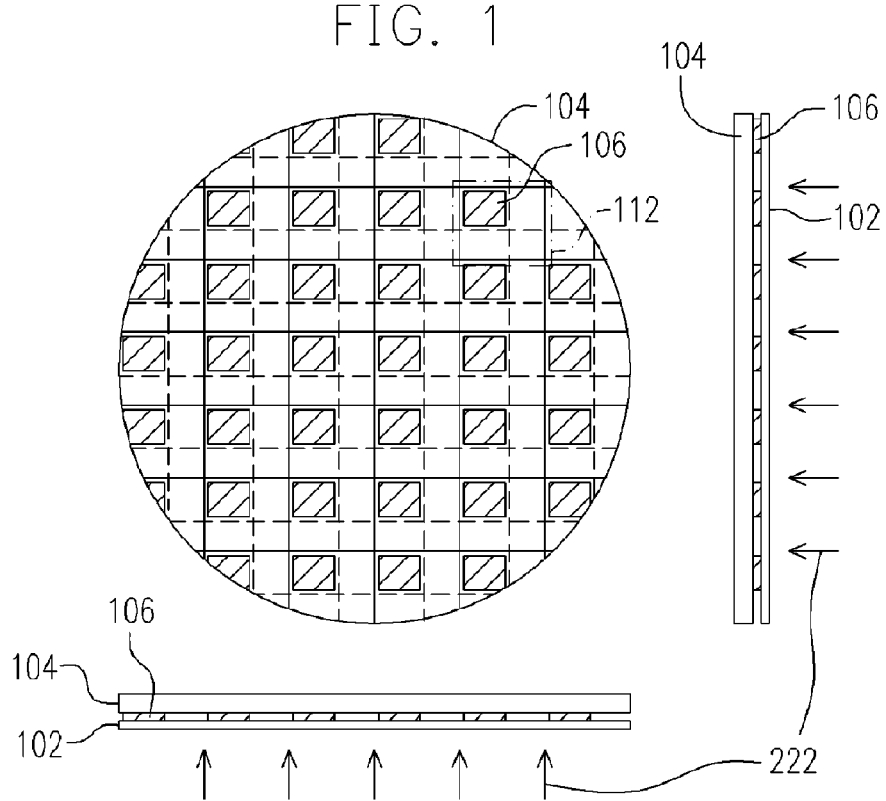

After attaching the first wafer 102 to the second substrate 104 using the adhesives 106, the exposed surface of the first wafer 102 of the selectively adhered wafer 108 facing the direction indicated by the cutting direction 222 in FIG. 2 is polished. The original thickness of the first wafer 102 is in a range of about 200 µm to about 500 µm. After the polishing process, the first wafer 102 of the selectively adhered wafer 108 has a thickness in a range of about 30 µm to about 250 µm. Preferably, the thickness of the first wafer 102 after the polishing process is in a range of about 30 µm to about 80 µm.

Referring to FIG. 2, the first wafer 102 of the selectively adhered wafer 108 is polished before proceeding with the following steps. However, it is to be noted that even if the polishing step is skipped, the following process steps are the same.

Figure 3A:
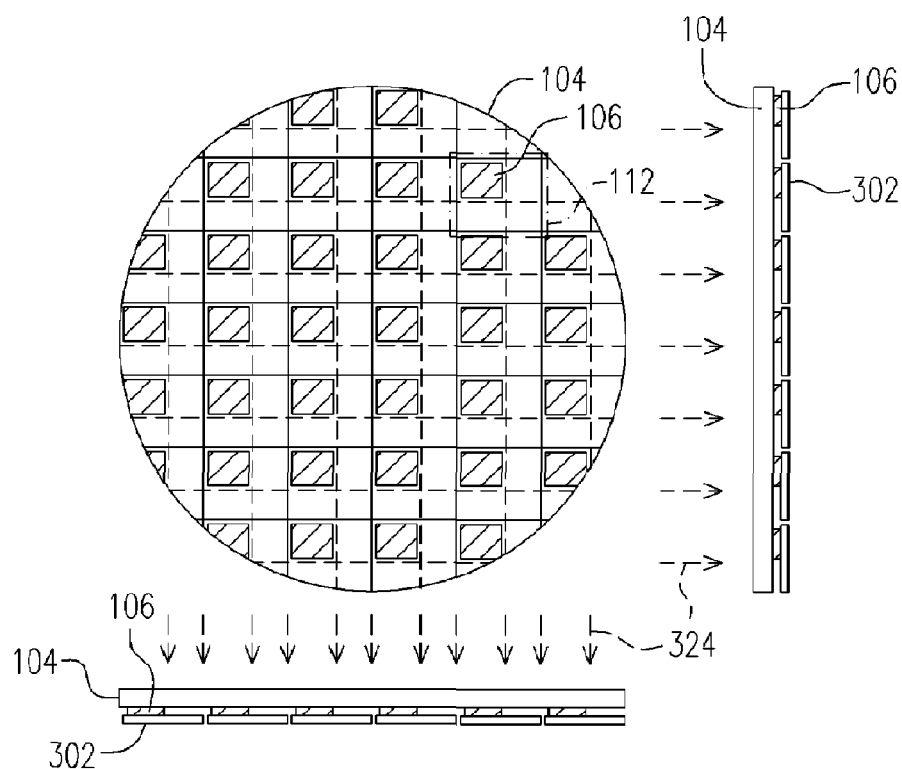
Figure 3B:
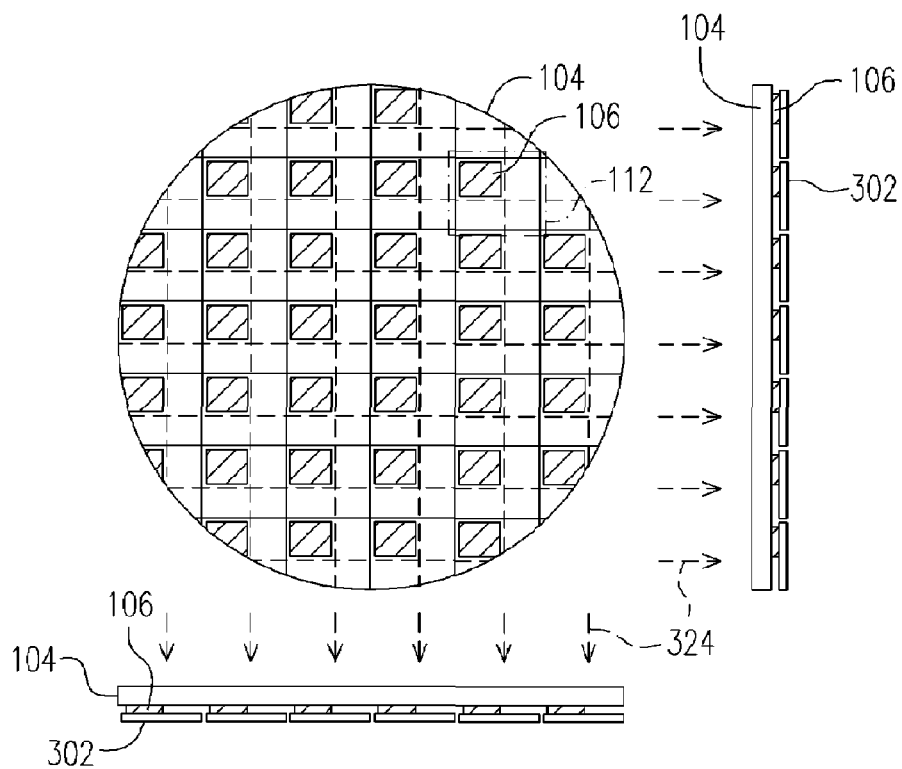

Next, the first wafer 102 of the selectively adhered wafer 108 is diced along the direction indicated by the cutting direction 222. The depth of the cut is greater than the thickness of the polished first wafer 102 but smaller than the total thickness of the first wafer 102 and the adhesive 106. Hence, the saw in the dicing process is prevented from cutting into the second substrate 104. Thereafter, the structure as shown in FIG. 3A and FIG. 3B may be obtained. In one embodiment of the present invention, the method of dicing the selectively adhered wafer 108 may comprise a diamond blade cutting method or a laser cutting method.

Figure 4A:
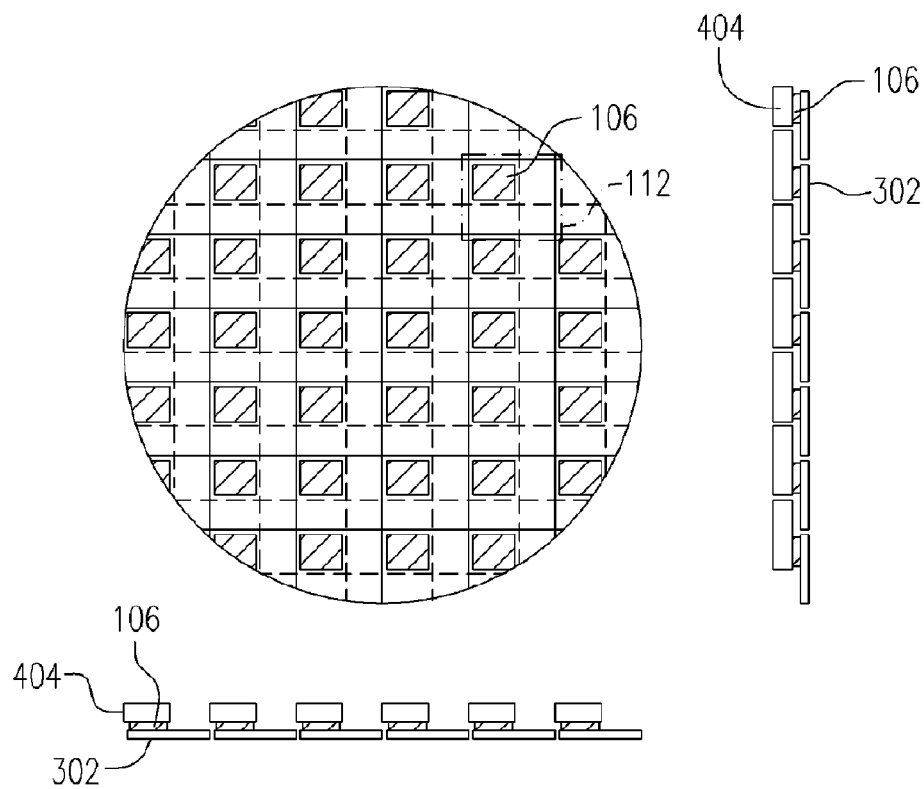
Figure 4B:
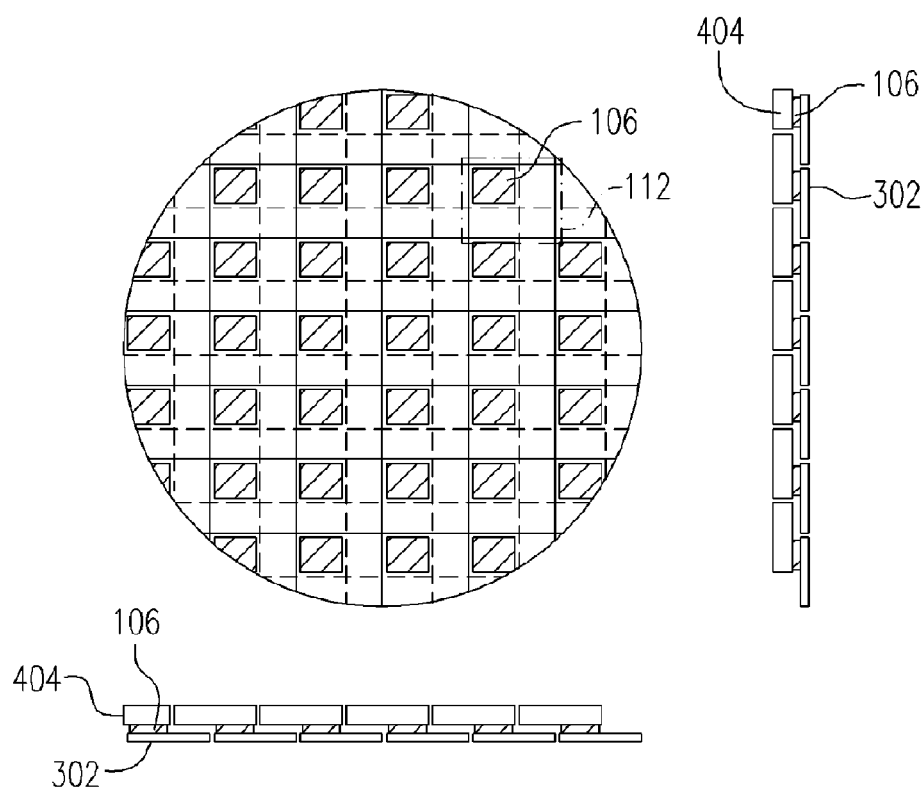

After the dicing process, the first wafer 102 is cut into a plurality of first base chips 302 as shown in FIGS. 3A and 3B. Thereafter, the second substrate 104 is diced along the direction indicated by the cutting direction 324 in FIGS. 3A and 3B. The depth of the cut is greater than the thickness of the second substrate 104 but smaller than the total thickness of the second substrate 104 and the adhesive 106. Thus, the saw in the dicing process is prevented from cutting into the first base chips 302. Referring to FIGS. 4A and 4B, after the second substrate 104 is diced up, the selectively adhered wafer 108 is cut into a plurality of independent chip sets, wherein each independent chip set comprising at least a first base chip 302, an adhesive 106 and a portion of the second substrate 404.

Figure 5A:
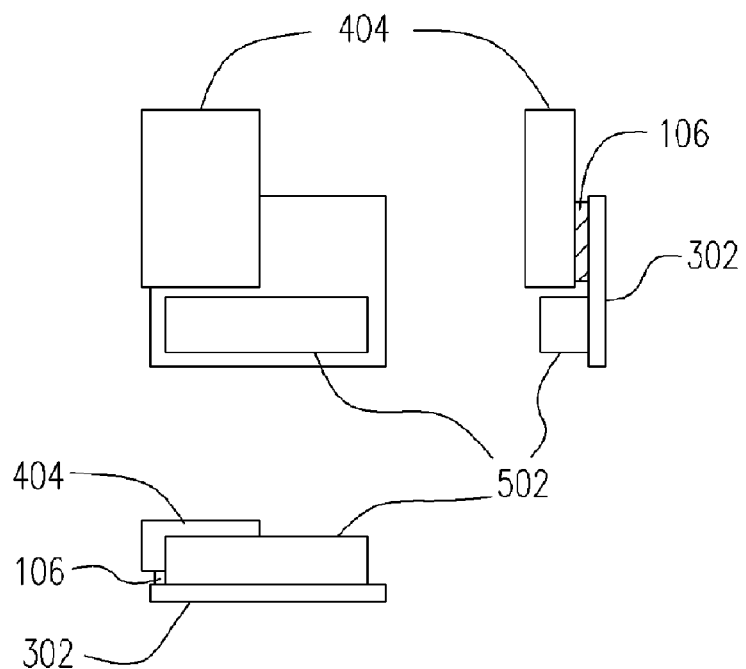

In a preferred embodiment of the invention, as shown in FIG. 5A, after the second substrate 104 is diced up along the cutting direction as shown in FIGS. 3A and 4A, an external stack chip 502 may be bound to the surface of the first base chip 302 of each or some of the independent chip sets. Thereafter, the whole structure as shown in FIG. 5A may be wired and packaged, wherein every packaged integrated circuits (IC) may comprise, the first base chip 302 and the stack chip 502 stacked on the first base chip 302. In one preferred embodiment of the present invention, a known good die (KGD) inspection of the stack chip 502 can be performed before the stack chip 502 is bound to the independent chip set. In addition, the thickness of the IC package is substantially similar to the whole thickness of the second substrate 404 and the first base chip 302.

Figure 6A:
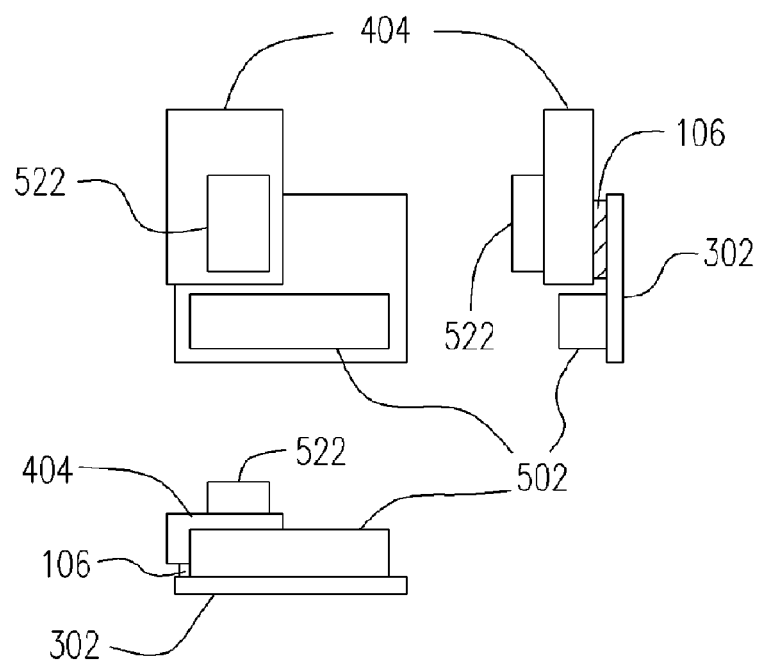

As shown in FIG. 6A, after binding the stack chip 502 to the first base chip 302 of the independent chip set, the independent chip set may be wired and packaged to form an integrated circuit (IC) package that at least comprises a first base chip 302, a stack chip 502 stacked on the first base chip 302, and one or more chips 522 on the cut second substrate 404. In addition, the thickness of the IC is substantially similar to the whole thickness of the second substrate 404 and the first base chip 302.

Figure 5B:
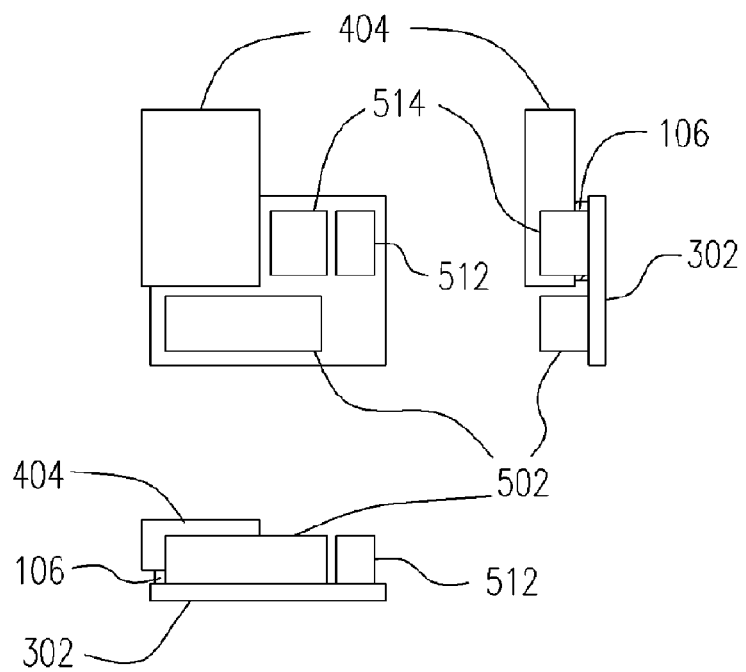

In an alternative embodiment as shown in FIG. 5B, a plurality of stack chips may bind to the surface of the first base chip 302 of the independent chip sets after the second substrate 104 is diced up. Here, only two stack chips 512 and 514 are shown, however, more than two stack chips can be provided in the present invention. In one preferred embodiment of this invention, a known good die (KGD) inspection of the stack chips 512 and 514 can be carried out before the stack chips are bound to the independent chip set. In addition, the thickness of the IC is substantially similar to the whole thickness of the second substrate 404 and the first base chip 302.

Figure 6B:
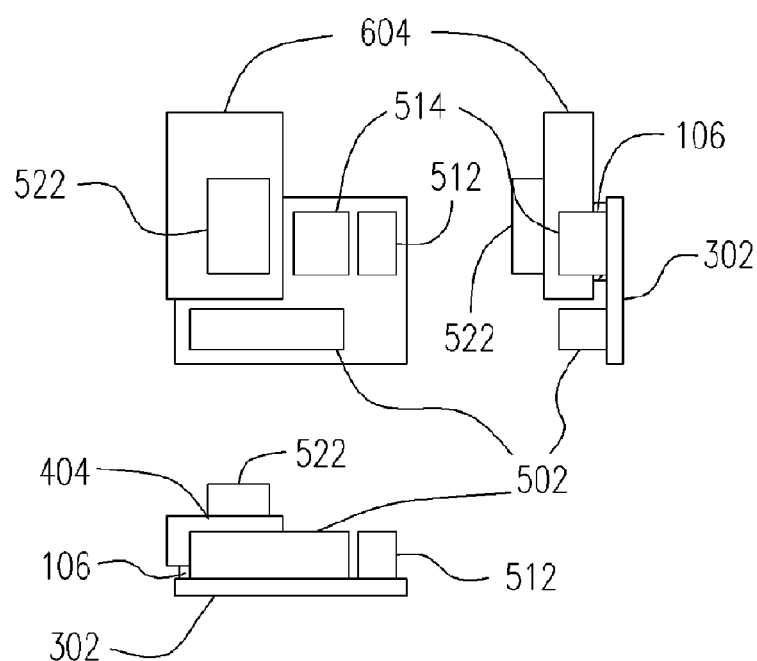

After binding the stack chips 512 and 514 to the first base chip 302 of the independent chip set, the excess portion of the second substrate 404 is removed to form a second base plate 604 as shown in FIG. 6B. Thereafter, the independent chip set is packaged to form an integrated circuit (IC) package at least comprising a first base chip 302, a plurality of stack chips 512 and 514, and one or more chips 522 on the cut second substrate 404. In addition, the thickness of the IC package is substantially similar to the whole thickness of the second substrate 404 and the first base chip 302.

Figure 7:
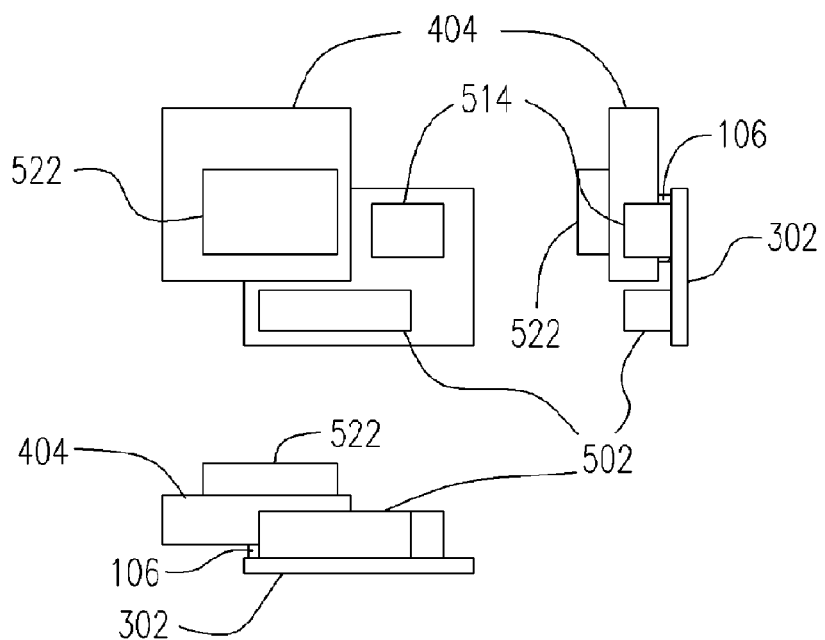
Figure 8:
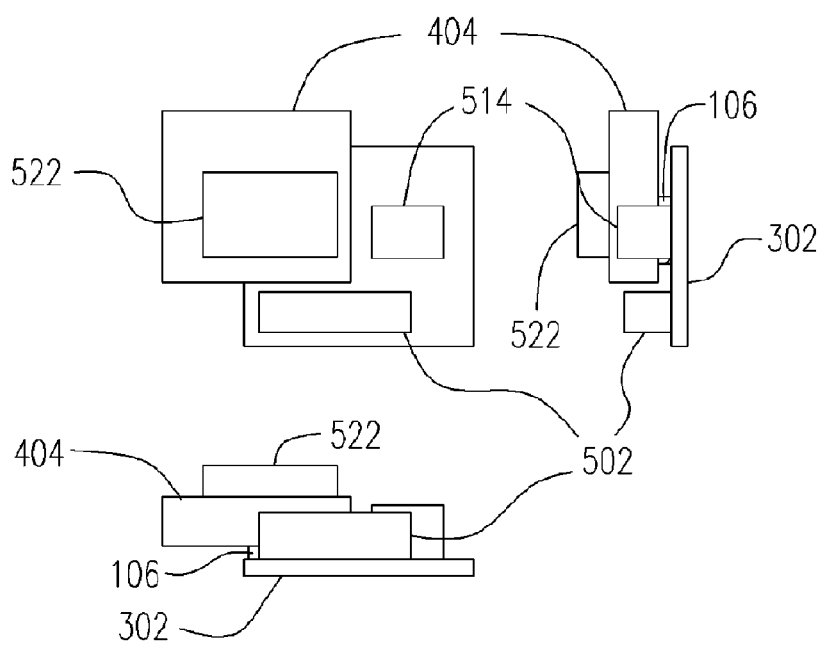

In another embodiment as shown in FIGS. 7 and 8, a plurality of independent chip sets may be obtained after the surface of the second wafer 104 of the selectively adhered wafer is diced along the directions shown in FIGS. 3B and 4B. In every independent chip set, the overlapped region between the second substrate 404 and the bas chip 302 may be dependent on the demand of the process. In addition, whether the chips 522, the stack chips 512 and 514 are disposed on the second substrate 404 may be dependent on the demand of the process.

In summary, the present invention provides an ultra-thin wafer level stack packaging structure as shown in FIGS. 7 and 8. The package structure comprises a base chip 302, a second base plate 604 and a stack chip 502 or a plurality of stack chips 512 and 514. The base chip 302 has a plurality of areas with the second base plate 604 bonded to one area of the base chip 302 by an adhesive 106, and with the stack chip 502 or the stack chips 512, 514 bonded to another area of the base chip 302. In addition, one or more chips 522 may be disposed on the second substrate 404. Moreover, the thickness of the IC package is substantially similar to the whole thickness of the chip 522, the second substrate 404 and the base chip 302.

This invention provides a method of forming an ultra-thin wafer level stack package. The advantages of the invention is that the selectively adhering of a second substrate to a first wafer having a plurality of base chips thereon can provide the reduction of the thickness of the first wafer, wherein the second substrate may be pre-designed to match with the first wafer. The thickness of the second substrate need not be too thick but need to be thick enough to maintain the selectively adhered wafer of the first wafer and prevent the second substrate from any deformation during the dicing process of the first wafer. Thus, for example, the second substrate may have a thickness close to that of a conventional wafer. By dicing the first wafer of the selectively adhered wafer, the problem caused from cutting a thin polished first wafer can be avoided. After binding a stack chip to the base chip, the entire assembly is packaged to form an integrated circuit (IC) package. The IC package may comprise at least a base chip and one or more stack chips, wherein the size of the IC package is substantially similar to the whole size of the base chip and the stack chip(s). In addition, the package has a size similar to the base chip and a thickness close to the combined thickness of the second substrat, the polished base chip and the adhesive. In other words, the package has a thickness close to a conventional wafer. Therefore, the package method of the present invention may provide a stack chip package structure.

Furthermore, through the packaging method of the present invention, chips fabricated by different processes can be integrated to form a single package. The circuits that can be fabricated by the same processing steps can be fabricated on the same chip to shorten the fabrication cycle thereof. In addition, chips manufactured by different processes may be packaged together, therefore, the packaged structure is light, thin, and small. Furthermore, if a 'known good die' inspection is incorporated to check the stack chips or the base chips, the yield will be improved significantly and the cost will be lowered considerably.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a wafer level stack package, comprising:
   providing a first wafer having a first surface and opposing second surface and having a plurality of base chips thereon;
   providing a second substrate, the second substrate having a first surface and opposing second surface and a plurality of chips wherein the chips of the second substrate is matched with respect to the position and size of the base chips of the first wafer;
   selectively binding a portion of the first surface of the first wafer to a portion of the first surface of the second substrate by using a plurality of adhesives to form, a selectively adhered first wafer wherein a distance between the first surface of the first wafer and the first surface of the second substrate is equal to a thickness of the adhesives;

forming a plurality of independent chip sets, wherein each of the independent chip sets comprises the base chip and the corresponding chip of the second substrate, an order of steps of forming the independent chip sets comprise:

a first cutting at the second surface of the first wafer of the selectively adhered first wafer, wherein a depth of the first cutting is greater than a thickness of the first wafer but smaller than the total thickness of the first wafer and the adhesive; and a second cutting at the second surface of the second substrate of the selectively adhered first wafer to form the independent chip sets, wherein a depth of the second cutting is greater than the thickness of the second substrate but smaller than the total thickness of the second substrate and the adhesive; and packaging the independent chip sets.

2. The method of claim 1, wherein a good die (KGD) inspection of the base chips of the first wafer is performed before the commencement of the packaging.

3. The method of claim 1, further comprising a step of binding a stack chip to the base chip of the independent chip sets after the step of forming the independent chip sets but before the step of packaging the independent chip sets.

4. The method of claim 3, wherein a good die (KGD) inspection of the stack chip is performed before the step of binding the stack chip to the base chip of the independent chip sets.

5. The method of claim 1, further comprising a step of binding a stack chip to each of the base chip of the independent chip sets after the step of forming the independent chip sets but before the step of packaging the independent chip sets.

6. The method of claim 5, wherein a good die (KGD) inspection of each of the stack chip is performed before the step of binding the stack chips to each one of the base chips of the independent chip sets.

7. The method of claim 1, wherein a thickness of the first wafer is in a range of about 200 μm to about 500 μm.

8. The method of claim 1, further comprising a step of polishing the second surface of the first wafer is performed after the step of forming the selectively adhered first wafer but before the step of cutting the second surface of the first wafer.

9. The method of claim 8, wherein a thickness of the first wafer is in a range of about 30 μm to about 250 μm after the second surface of the first wafer of the selectively adhered first wafer is polished.

10. The method of claim 8, wherein a thickness of the first wafer is in a range of about 30 μm to about 80 μm after the second surface of the first wafer of the selectively adhered first wafer is polished.

11. The method of claim 1, wherein the second substrate comprises a plurality of chips, and a position and size of each of the chips is matched with those of the base chips of the first wafer.

12. The method of claim 1, wherein a method of forming the adhesives comprise a dispensing method.

13. The method of claim 1, wherein a method of forming the adhesives comprises forming a double side tape having a region comprising the adhesives.

14. The method of claim 1, wherein after the selectively adhered first wafer is obtained and before the independent chip sets are formed, further comprises performing a thermal curing step for curing the adhesives.

15. The method of claim 1, wherein a method of cutting the selectively adhered first wafer comprises a diamond blade cutting method or a laser cutting method.

16. The method of claim 1, wherein the second substrate comprises a glass substrate.

17. The method of claim 1, wherein the second substrate comprises a silicon wafer substrate.

18. The method of claim 1, wherein the second substrate comprises a plastic substrate.

19. The method of claim 1, wherein the second substrate comprises an acrylic substrate.

20. The method of claim 1, wherein the second substrate comprises a polymer substrate.

21. The method of claim 1, wherein the second substrate is fabricated using a transparent material.

22. The method of claim 1, wherein the second substrate is fabricated using a non-transparent material.

* * * * *